United States Patent [19]

Rzedzian

[11] Patent Number: 4,940,941
[45] Date of Patent: *Jul. 10, 1990

[54] METHOD OF HIGH-SPEED MAGNETIC RESONANCE IMAGING

[75] Inventor: Richard R. Rzedzian, Lexington, Mass.

[73] Assignee: Advanced NMR Systems, Inc., Woburn, Mass.

[*] Notice: The portion of the term of this patent subsequent to Apr. 26, 2005 has been disclaimed.

[21] Appl. No.: 331,806

[22] Filed: Apr. 3, 1989

Related U.S. Application Data

[63] Continuation-in-part of Ser. No. 109,091, Oct. 16, 1987, Pat. No. 4,818,942, which is a continuation-in-part of Ser. No. 937,529, Dec. 3, 1986, Pat. No. 4,740,748.

[51] Int. Cl.$^5$ .......................................... G01R 33/20
[52] U.S. Cl. ..................................... 324/312; 324/309
[58] Field of Search ................. 324/307, 309, 311, 312

[56] References Cited

U.S. PATENT DOCUMENTS

| | | | |
|---|---|---|---|
| Re. 32,712 | 7/1988 | Likes | 324/307 |
| 4,355,282 | 10/1982 | Young et al. | 324/309 |
| 4,509,015 | 4/1985 | Ordidge et al. | 324/309 |
| 4,794,337 | 12/1988 | Twieg | 324/312 |

OTHER PUBLICATIONS

Crookes et al., "Echo Planar Imaging at 0.35T with One Half of a Data Set", 5th Annual Mtg. of Soc. of Mag. Resonance, Aug. 19–22, 1986, pp. 946–947.
Crookes et al., "Manipulation of T2 Contrast in Echo Planar Imaging at 0.35T", 5th Annual Mtg. of Soc. of Mag. Resonance, Aug. 19–22, 1986, pp. 948–949.
Feinberg et al., "Echo Planar–Inner Volume Imaging at 0.35T", 5th Annual Mtg. of Soc. of Mag. Resonance, Aug. 19–22, 1986, p. 950.
Feinberg et al., "Halving Imaging Time at 0.35T in 2-D Ft Multi-Section, Multi-Echo MRI", 5th Annual Mtg. of Soc. of Mag. Resonance, Aug. 19–22, 1986, pp. 951–952.

Primary Examiner—Jerry W. Myracle
Assistant Examiner—Kevin D. O'Shea
Attorney, Agent, or Firm—Ostrolenk, Faber, Gerb & Soffen

[57] ABSTRACT

A method of high-speed magnetic resonance imaging in which the object to be imaged is placed in a high static magnetic field. Nuclear spins are excited in an image area by applying a pulse of radio frequency magnetic field. Optionally, a first gradient field, termed a slice selection gradient, may be applied in conjunction with the RF excitation pulse such that spins are excited only in a selected plane of the object. Following an encoding pulse sequence and rephasing of the nuclear spins by the application of a 180° radio frequency pulse, mutually orthogonal phase-encoding and readout gradients are alternatively applied in the image plane to effect a traversal through spatial frequency domain (k-space). In a preferred embodiment of the invention, the readout gradient is applied as a continuous sinusoidal wave, resulting in a slight overlap between the phase-encoding and readout gradients. If phase errors vary slowly in time, only a partial k-space trajectory is required. Chemical shift is eliminated either by the application of a suppression pulse of RF field or by tailoring the frequency spectrum of the rephasing pulse so as to preclude rephasing of one or other of the chemical moieties.

39 Claims, 5 Drawing Sheets

METHOD OF HIGH-SPEED MAGNETIC RESONANCE IMAGING

RELATED APPLICATIONS

This is a continuation-in-part of U.S. application Ser. No. 109,091, filed Oct. 16, 1987, now U.S. Pat. No. 4,818,942, which is a continuation-in-part of U.S. application Ser. No. 937,529, filed Dec. 3, 1986, now U.S. Pat. No. 4,740,748. This application is also related to U.S. application Ser. No. 085,568, now U.S. Pat. No. 4,767,991. The disclosures of each of these related patents are herein incorporated by reference.

BACKGROUND OF THE INVENTION

The present invention relates to magnetic resonance imaging (MRI) techniques and, more particularly, to a technique for imaging at speeds faster than about 100 milliseconds.

For various reasons, it would be desirable to provide a technique for magnetic resonance imaging (MRI) in which images can be obtained in a very short period of time. Primary among the factors currently limiting the rate of growth of MRI in the diagnostic imaging marketplace are concerns relating to its cost-effectiveness, and its limited applicability to the study of organ systems subject to significant involuntary physiological motion, especially of the heart. Both of these problems (especially the latter) would be alleviated if the long data acquisition times (typically several minutes) could be decreased. This would reduce the total patient study time, increase patient throughput and hence optimize cost-effectiveness. If the total scan time is reduced to a small fraction of the cardiac period, motion artifacts due to all physiological motions including that of the heart, can be avoided.

Early high-speed whole body biological images suffered both from poor spatial resolution and from poor signal-to-noise ratio (SNR). (As used herein, "high-speed" signifies about 100 milliseconds for acquisition of a complete image). This low quality is, in part, a reflection of the relatively low magnetic field strength used. However, it is known that SNR increases approximately linearly with field strength, and thus higher quality images can, in principle, be obtained at higher field strengths.

Several problems are confronted in implementing high-speed imaging at high-field strengths, and the invention described herein provides solutions to these problems.

One major problem in using high magnetic fields for magnetic resonance imaging is that inhomogeneities in the magnetic field are, for practical purposes, unavoidable, and can introduce phase and geometrical distortion into magnetic resonance images of an object under investigation. Such magnetic inhomogeneities are introduced from two distinct sources. First, a static magnetic field has an inherent non-uniformity which typically varies in proportion to the magnetic field strength. As a practical matter, such inhomogeneity is considered unavoidable in the static magnetic field, since to eliminate it would be unduly difficult and unduly expensive. Secondly, the magnetic susceptibility of an object being imaged provides an object dependent additional contribution to the magnetic inhomogeneities in the system.

Additionally, at high frequencies the RF field is attenuated and subject to phase shifts when penetrating a weakly conductive object, such as a human body. This effect is certainly in evidence at 85 MHz, which is the proton resonance frequency at around 2 Tesla.

A further major problem in imaging at high field is the proton "chemical shift" effect. This problem arises because the signal from any given point in the image may, in general, contain essentially two closely-spaced frequencies; one from water protons and one from lipid protons. The imaging procedures used in MRI place signals deriving from particular volume elements into corresponding picture elements in the final image based on their unique frequencies; hence, the two distinct frequencies deriving from lipid and water in the same volume element of tissue will be incorrectly placed into different picture elements. This results in two superimposed images. This problem is usually solved at lower field strengths, or for slower imaging methods, simply by increasing the strength of the magnetic field gradients which provide the spatial discrimination in the image, to the extent that the bandwidth they impose per picture element is substantially greater than the frequency separation of the proton resonances of fat and water. In the case of high-speed imaging, the uses of such high bandwidths per picture element would be prohibitively difficult to implement. Furthermore, the bandwidth would necessarily have to increase with field strength, thereby reducing any SNR increases to a square root of field strength dependency.

SUMMARY OF THE INVENTION

Accordingly, to overcome the foregoing problems present in high-speed magnetic resonance imaging with high magnetic fields, applicant has devised a method and apparatus for rapidly obtaining magnetic images from an object. The object is placed in a static magnetic field along a first axis, conventionally referred to herein as the "z" axis. The magnetic field along the z axis has an intensity in the range from about 0.5 to 5 Tesla. Nuclear spins are excited in an image area by applying a radio frequency (RF) excitation pulse, whereby free induction decay signals are produced by the excited nuclear spins. Optionally, a first gradient field, termed a slice selection gradient, may be applied in conjunction with a spatially tailored RF excitation pulse such that spins are excited only in a selected plane of the object. In that case, during the RF excitation, dephasing of nuclear spins may occur across the width of the selected plane, and rephasing of the nuclear spins is required. Rephasing may be achieved either by reversing the first gradient field or by reapplying a similar first gradient waveform following the application of a 180° pulse (to be discussed below).

Second and third magnetic gradients, termed phase-encoding and readout gradients, respectively, are applied in the x and y directions, respectively. As is conventional, the x, y, and z directions are assumed to be mutually orthogonal. If slice selection is performed, the selected area is in the x-y plane, which is commonly referred to as the transverse plane.

The time-varying phase-encoding and readout gradients perform the function of changing the phases of the temporal nuclear signals in a spatially variant manner, i.e., determining the points in the spatial frequency domain which are sampled at specific times during the acquisition of data. The resulting trajectory of sample points in k-space is known as the k-trajectory.

The decoding process involves several steps of initial processing followed by the operation of two dimensional Fourier transform, and yields a discrete image which is an estimate of the original spatial distribution.

In order to set the point in k-space at which sampling will begin, an encoding sequence occurs prior to sampling. Thereafter, a radio frequency signal is applied to the object to rephase any of the subject nuclear spins that have become dephased due to non-uniformities in the static magnetic field. Next, the data are sampled by a sequence in which phase encoding and readout gradients are alternately applied. In a preferred embodiment of the invention, the readout gradient is applied as a continuous sinusoidal wave, resulting in a slight overlap between the phase-encoding and readout gradients. This sampling of data occurs with an imaging period of less than about 100 milliseconds.

If there were no phase distortions introduced as a result of magnetic field non-uniformities, or by any other cause, it would be sufficient that the k-trajectory covered lines only in the positive or negative half of k-space. Corresponding data lines sampled in the opposite half of k-space would contain identically conjugated data, and hence only yield data redundancy. However, in the presence of phase distortions, corresponding data lines in opposite halves of k-space are not identical.

It has been discovered that information derived from the extension of the sampling trajectory to more than half of k-space may be used to compensate for phase errors. The extension of sampling required depends on the extent of phase errors introduced. For example, if phase errors vary only slowly over the image (i.e., the errors have low spatial frequencies), relatively little additional trajectory needs to be sampled. By sampling only those additional lines necessary for adequate phase correction, the total acquisition time is minimized, and the time of initiation of data sampling following the initial excitation pulse(s) is minimized. This latter consequence is desirable in that signal decay as a result of $T_2$ is thereby minimized. Furthermore, the signal-to-noise (SNR) of the output is optimized, provided that the SNR loss due to $T_2$ decay is greater than the SNR loss resulting from the acquisition of fewer data lines. For a more complete discussion of partial k-space sampling, see U.S. Pat. No. 4,767,991, the disclosure of which is herein incorporated by reference.

In order to eliminate the chemical shift problem referred to previously, two preferred embodiments are described. In one embodiment, prior to slice-select, a narrow-band "suppression" pulse of RF field is applied, followed by a pulse of magnetic field gradient substantially greater in spin dephasing power than any subsequent gradient in the imaging sequence. This effectively eliminates signals from one of the chemical moieties, lipid or water. In another embodiment, the 180° refocussing pulse is selected such that its frequency spectrum and "off-resonance" effect combine so as to preclude rephasing of one or other of the moieties.

Other objects, features and advantages of the invention will become apparent from the following description of the preferred embodiments of the invention, considered in connection with the accompanying drawings and appended claims.

DETAILED DESCRIPTION OF THE PREFERRED EMBODIMENT

Figure 1:
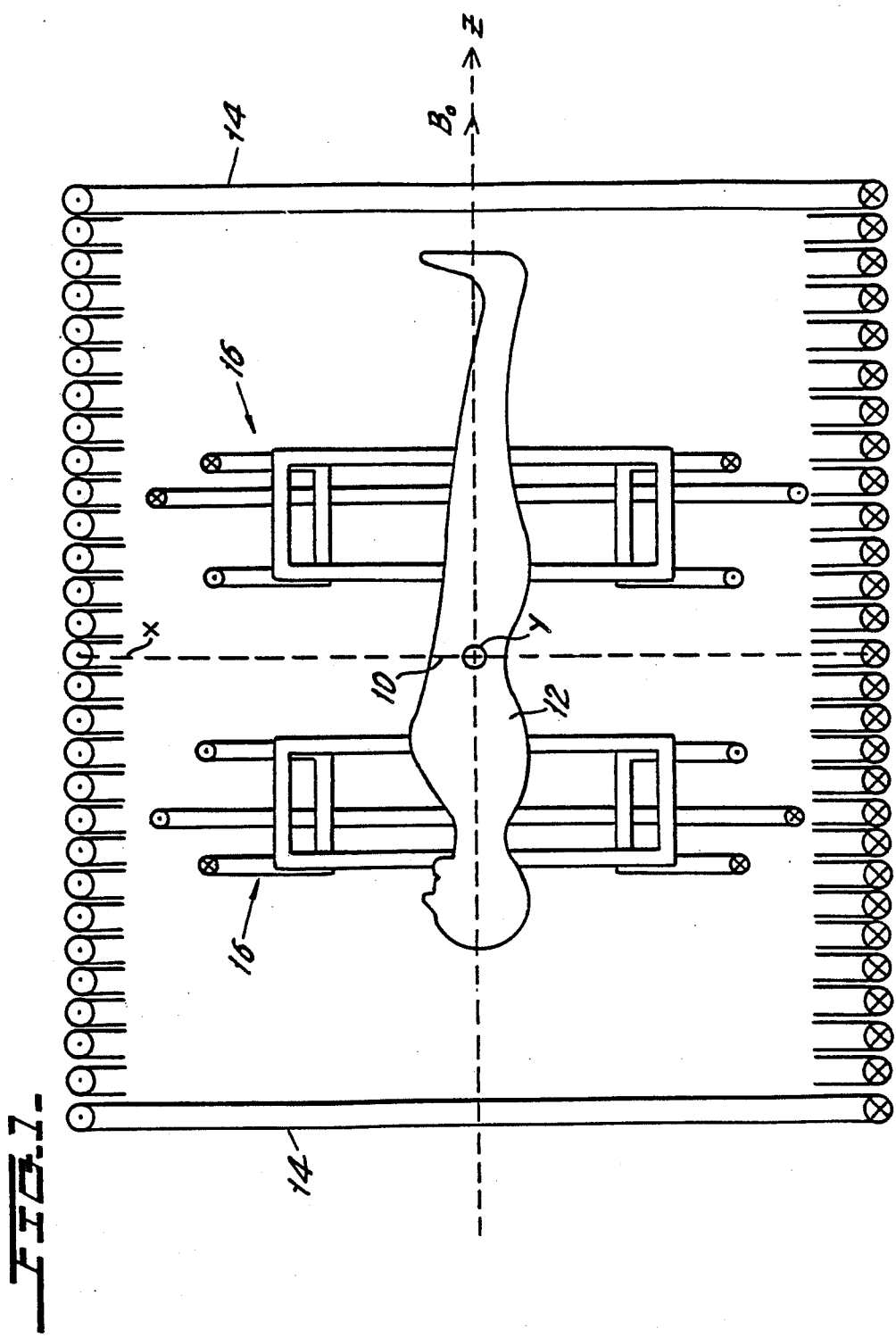
FIG. 1 is a simplified view of an object being imaged positioned within a magnet, illustrating the conventional spatial coordinate system x, y, z for the magnetic gradients referred to throughout the specification and claims.

Referring first to FIG. 1, it is desired to obtain a magnetic resonance (MR) image of an object 12, such as a human body (optionally in a selected area 10), positioned within a magnet 14. As shown in FIG. 1, optional selected area 10 exists within a plane defined by the orientation of the applied field gradients in the x, y, and z directions which are generated by the coil structure 16. For the purpose of the following description, as is the usual convention, the direction of the static magnetic field $B_o$ is taken to define to z-axis. Also by way of example, it is assumed that the first gradient field (applied if slice selection is employed and termed the slice-selection gradient) is applied in the z-direction, the second gradient field (the phase encoding gradient) is applied in the x-direction; and the third gradient field (the readout gradient) is applied in the y-direction. The x, y and z directions are taken to be mutually orthogonal. Thus, the selected area 10 falls in the x-y plane. For a human subject lying with its longitudinal axis parallel to the z-axis, this x-y plane is commonly referred to as the transverse plane.

Obviously, the above-recited coordinate assignment of the first, second and third gradient fields as applied in the x, y and z directions is not exclusive. For example, a defined area in the x-z or y-z planes may be selected by assuming that the first gradient field (slice-selection gradient) is applied in the y or x directions respectively, with the second (phase-encoding) and third (readout) gradients applied in the x and z or y and z direction respectively. The defined area will then be a coronal or sagittal plane. Furthermore, in general, the first, second and third gradients need not necessarily lie along any of the directions x, y, or z defined above. Whilst maintaining their mutual orthogonality, the said first, second and third gradients can be rotated to point along a transformed coordinate set $x_1$, $y_1$, and $z_1$, in which case arbitrarily oriented "oblique" planes may be selected and imaged from a viewpoint perpendicular to the plane. Finally, the first, second and third gradients need not necessarily be mutually orthogonal, in which case, for instance, arbitrarily oriented oblique planes may be selected and then obliquely imaged, i.e., from a viewpoint oblique to the plane. These variations of coordinate assignments are well-known to those skilled in the art.

For the particular coordinate assignment of gradient fields recited above, the gradients $G_x$ and $G_y$ and $G_z$ are defined by:

$$G_x = \frac{dB_z}{dx} \, ; \, G_y = \frac{dB_z}{dy} \, ; \, G_z = \frac{dB_z}{dz}$$

In accordance with the invention, the object undergoing investigation is at all times subjected to a continuous magnetic field $B_o$ along the z-axis. The level of magnetic field chosen must be sufficiently high that an adequate signal-to-noise ratio (SNR) is obtained, with an adequate spatial resolution, in the final image. Further, the requirement of adequate spatial resolution places demands on the strength of the phase-encoding and readout gradients, the latter placing concomitant demands on the required signal bandwidth of the radio-frequency antenna which collects the signal which, in turn, has to possess as high a quality factor (Q) as possible for optimal SNR.

For adequate SNR's in the range of approximately 10:1 to 100:1, and adequate spatial resolutions in the range of approximately 5 mm to 1 mm for an adult human body, using the applicant's method these constraints require a field strength in the range of about 0.5 to 5.0 Tesla. In the preferred embodiment of the invention, the field strength is 2.0 Tesla. This level of magnetic field is sufficiently high that non-uniformities in the field are introduced by the subject itself which must be compensated for by techniques described hereafter. The high magnetic field advantageously allows spectral resolution of signals from specific molecular compounds to avoid the chemical shift problem. Techniques for performing the spectral resolution are also discussed hereinafter.

Figure 2:
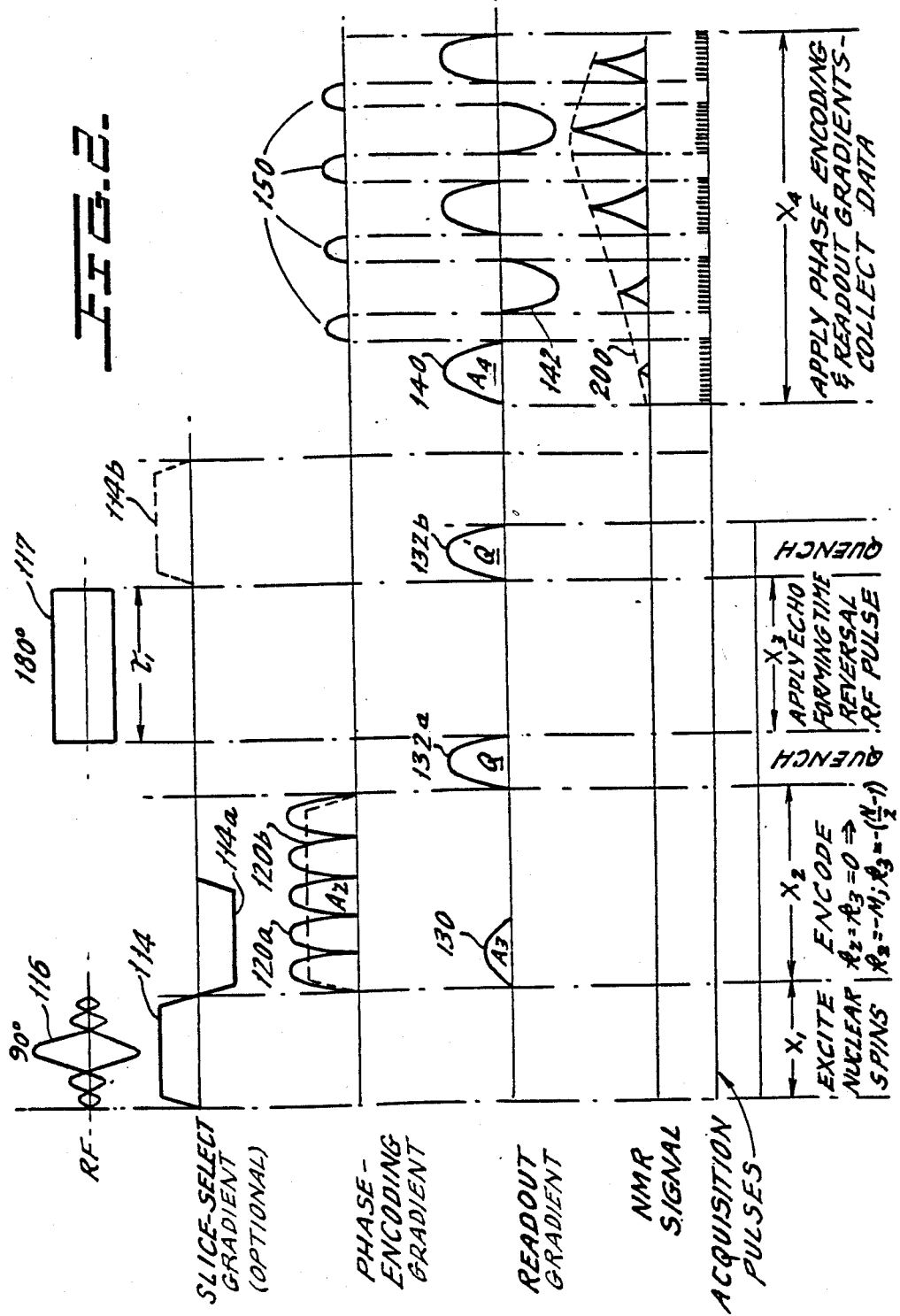
FIG. 2 is a preferred pulse sequence in accordance with the present invention.

Turning now to the pulse sequence shown in FIG. 2, reference is made to the time intervals $x_1$ through $x_4$. In interval $x_1$, nuclear spins are excited in the object undergoing investigation by applying a 90° RF pulse 116. RF pulses of less than or greater than 90° can also be applied, but for these purposes a 90° pulse is preferred. If it is desired to select a region of the body (such as a plane 10 as shown in FIG. 1), this can be accomplished by superimposing on the static magnetic field a first gradient field, for example, $G_z$, preferably having waveform 114. The 90° radio frequency (RF) pulse 116 would then be spectrally tailored and applied during steady application of the gradient $G_z$. During this RF excitation, dephasing of the nuclear spins may occur across the width of the selected plane, and subsequent rephasing is necessary in order to obtain maximum signal amplitude and minimum phase distortion. Such rephasing is achieved by reversing the first gradient field as indicated in the waveform 114 at 114a. Alternatively, rephasing may be delayed, for example to time interval $x_4$ (after application of the 180° pulse, described hereinafter), in which case a waveform of the type shown at 114b may be employed. Other procedures for slice selection or other suitable waveforms for $G_z$ and various spectral tailoring schemes for the 90° pulse will be readily apparent to those skilled in the art.

In accordance with the present invention, an encoding sequence occurs during the time interval $x_2$. Encoding the signal has the effect of determining the point (or, in the pulse sequence of FIG. 2, the conjugate point) in k-space from which data sampling will commence. The particular waveforms 120a, 120b and 130 suggested are not exclusive; many suitable waveforms for the second and third gradients ($G_x$ and $G_y$) will be apparent to those in the art. For example, the waveform of the second gradient may be trapezoidal, as shown at 120b. Alternatively, a similar area $A_2$ may be swept out by multiple, short, gradient pulses, of the same waveform shape as required in time period $x_4$ of the pulse sequence. The fundamental parameter is the area under the waveforms represented by $A_2$ for the second gradient field and $A_3$ for the third gradient field, since these areas are related mathematically to the k-space trajectory. Thus, while practical considerations dictate particular waveforms in time period $x_4$, the waveforms used in the encoding period $x_2$ may be of any one of a number of suitable shapes.

Figure 3:
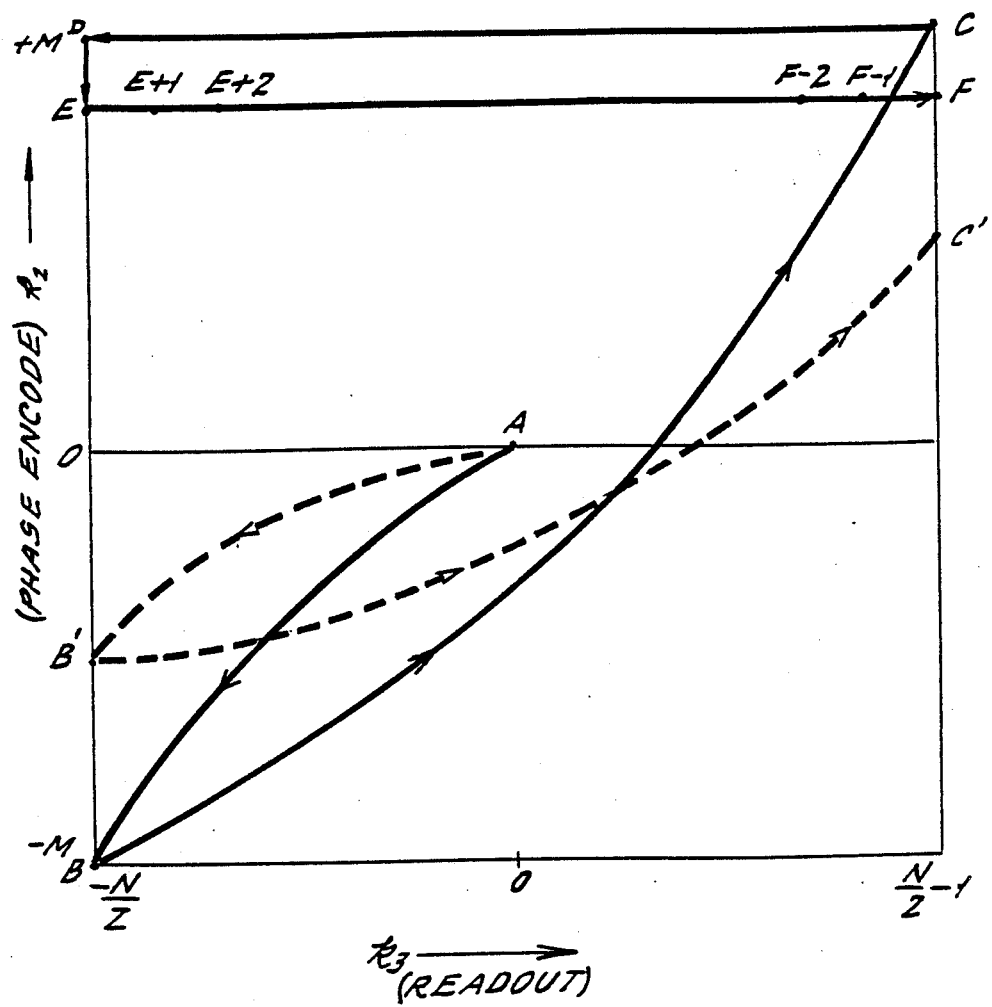
FIG. 3 is the graph of spatial or Fourier domain frequencies of the image of the object in FIG. 1 being investigated.

FIG. 3 shows a representation of k-space, i.e., the spatial frequency domain, where lines over which the k-trajectory is sampled correspond directly to discrete spatial-frequency coordinates. The vertical axis, $k_2$, represents the spatial frequency coordinates corresponding to the second gradient field (phase encoding). The horizontal axis, $k_3$, represents the spatial frequency coordinates of the third gradient field (readout). The time $t=t_o$ immediately following the RF excitation period $x_1$ and prior to any encoding defines the origin $k_2=k_3=0$ of the k-trajectory in k-space, and is denoted as A in FIG. 3. The encoding sequence in time interval $x_2$ maps out a trajectory, the time dependence of which depends on the actual waveform shapes 120a, 120b and 130. However, the position of the trajectory at the end of encoding period $x_2$ depends only on the areas $A_2$ and $A_3$; and these can be set arbitrarily. One particularly preferred setting of the areas $A_2$ and $A_3$ is such that the position of the trajectory at the end of the preencoding period $x_2$ is $k_2=(k_2)i=-M$ and $k_3=(k_3)j=-N/2$, denoted B on FIG. 3.

Referring again to FIG. 2, during the time interval $x_3$, an RF pulse 117 is applied to the object. The main purpose of RF pulse 117 is to rephase nuclear spins that have become dephased due to non-uniformities in the static magnetic field $B_o$. When measured as a fraction of the main magnetic field strength, such non-uniformities are similar for most typical magnets which generate fields in the range 0.5 to 5.0 Tesla, i.e., typically the non-uniformities are between 1 and 10 parts per million of the applied field strength $B_o$ over the region of the object being imaged. In absolute terms, therefore, the non-uniformity is more severe at higher fields. To accomplish the rephasing functions of the RF pulse 117, such pulse is preferably configured as a 180° pulse.

The use of the 180° pulse 117 is conventionally known to result in a mirror image or spin-echo of the original MR signal which resulted following the initial 90° RF pulse 116. Such echo effect is illustrated by the dashed line 200 in FIG. 3, which grows and decays with the time constant $T_2^*$ (T-two-star). $T_2^*$ is a time constant for loss of phase coherence among nuclear spins in a non-uniform magnetic field, and is defined in the art. It is also well known that a spectrally tailored 180° pulse can be applied with a magnetic field gradient in any direction to effect slice selection. If this direction is the same as the direction of the slice selection gradient 114 applied during the initial 90° pulse, then the planes selected by the 90° and 180° pulses will be co-planar.

As an incident to the use of 180° RF pulse 117 to rephase the nuclear spins, a trajectory from B to the conjugate position C is effected in k-space, where C is defined by the spatial frequency coordinates $k_2=(k_2)i=+M$; $(k_3)j=+N/2$. Since the RF field generated by a typical RF transmitting coil is not perfectly uniform, there is the possibility that the actual pulse angle of the RF pulse 117 varies over the volume occupied by the object. In particular, it may be inaccurate in positions outside of the optionally selected plane (which did not receive the initial 90° exciting pulse 116), as compared to positions in the plane. Nuclei outside of the selected plane, not having experienced the prior 90° pulse 116, will generate unwanted signal if the pulse angle of the RF pulses 117 is not exactly 180°. In order to eliminate this unwanted signal, equal pulses of gradient may be applied to each side of the 180° RF pulse 117; for example, gradient pulses generated by the third gradient may be applied, denoted 132a and 132b in FIG. 3. If the areas Q and $Q^1$ under the gradient waveforms 132a and 132b are identical, which is the required case, no net phase encoding will be conferred upon the spins within the plane of interest after completion of the waveform 132b because of the 180° reversal applied between the waveforms. However, signal generated outside of the selected plane by RF pulse 117, as a result of RF field non-uniformity, will be dephased by pulse 132b, and the remainder of the pulse sequence is designed such that the rephasing of these particular spins will not occur. This procedure effectively eliminates any "out-of-plane" signal in a reasonably extended sample with adequate homogeneity.

As an alternative, or in addition to the procedure just described, it is possible to use the gradient pulse 114b instead of 114a. In this case, the dephased spins within the slice are rephased only after the 180° RF pulse by gradient 114b, which at this point in the pulse sequence also dephases any signal generated outside the selected plane by RF pulse 117.

Note that in the case of co-planar slice selection (discussed above), the nuclear spins outside of the selected plane will not experience any excitation, and therefore will not generate unwanted signal.

In a further embodiment of the invention, the 180° RF pulse is omitted and all echoes are formed by the application of gradients alone. In this case, referring to FIG. 3, there is no trajectory from point B to point C, and instead, the traverse of k-space now commences from point B, and proceeds in the positive direction $k_2$. In the case of the partial filling of k-space (described later), the traverse now begins from point B'. Note that the first traversal along $k_3$ is in the positive $k_3$ direction, which is opposite to the first traversal of the case in which the 180° pulse is applied. This means that the third (readout) gradient must be applied in the opposite polarity. Also, since the traversal of k-space proceeds in the positive $k_2$ direction, the second (phase-encoding) gradient must be applied in the polarity to the case which contains the 180° pulse.

In accordance with an important aspect of the present invention, complete data for a MR image is acquired in less than about 100 milliseconds and preferably within a time less than the characteristic decay time $T_2$ (T-two) of the nuclei selected in the plane of interest. Data acquisition in such a short time period has been found necessary for reducing to virtually zero any deleterious effects in the image due to motion of bodily organs such as the heart. Such rapid data collection is accomplished in interval $x_4$ in the pulse sequence of FIG. 2 by alternately applying the second (phase-encoding) and third (readout) gradients to the object being imaged.

In accordance with the invention, the waveform shape 140 of the readout gradient cannot be trapezoidal as had been suggested by the prior art literature. The use of a trapezoidal readout gradient will cause severe problems because the electrical inductance of the gradient producing coils is necessarily large in order to achieve the magnitude of gradient fields required. Consequently, the rise times of the gradient waveforms, which have to be sufficiently rapid to acquire the necessary data in the time frame discussed above, can only be achieved in practice by the use of impractical amounts of power. The preferred method for generating theses rapidly-varying gradient fields is described in U.S. Pat. No. 4,628,264, assigned to the same assignee as the present invention, and yields gradient waveform segments 132a and 132b which are approximately sinusoidal in shape.

With continuing reference to FIG. 2, if the area $A_3$ under the gradient waveform 130 is made as closely as possible to half the area $A_4$ under waveform 140, a rephasing of the nuclear signal in the direction of the third gradient field will occur, and maximum rephasing of the signal in this direction will occur approximately at the peak of the gradient waveform 140. The signal may be sampled in time in such a fashion that each sample point is acquired after an equal area is swept out by the gradient waveform 140, and hence equal increments of net phase rotation are incurred by the nuclear spins. This non-linear sampling scheme, in which the time dependence of the sampling "comb" is constrained to match exactly the gradient waveform shape 140, has been described in the art. See, for example, U.S. Pat. No. 4,509,015 to Ordidge and Mansfield entitled "Nuclear Magnetic Resonance Methods".

Other schemes for sampling and processing the data are, of course, also possible. In one such scheme, the data are acquired with equal time increments between the sampling points and rapidly enough to adequately describe the highest frequency components of the signal Subsequently, the data may be processed, for instance, by interpolation and resampling, such that the steps in k-space are approximately in equal increments along $k_3$. An oversampling of the data along $k_3$ may be necessary in both equal and non-equal time interval cases in order to compensate for any instrumental effects. Further, because the gradient shape may vary throughout space due to eddy current effects, no single set of non-equal sampling intervals may be adequate to accurately estimate the diffraction pattern of the object. In such a case, the spatially dependent gradient shapes can be measured in advance in order to provide information to compensate for this effect.

At the end of sampling the spin echo generated during the gradient waveform 140, the k-trajectory has moved from $k_2$, $k_3=(M, N/2 -1)$ to $k_2,k_3=(M, -N/2)$, i.e., to point D on FIG. 3. In particular, non-linear sampling during data acquisition is such that the k-trajectory is sampled in equal increments along the $k_3$ line from C to D. (Note that maximum rephasing in the third gradient direction occurs as the trajectory passes through the $k_3=0$ line.)

Thus sampling is performed at points trajectory along points $k_3$ such that the steps are $$\Delta k_3 = \frac{2\pi}{x_3} = \gamma \int_{t_i}^{t_i + 1} G_3(t)dt,$$

where $X_3$ is the spatial field of view in the third direction, $G_3$ is the strength of the third gradient, and $t_i$ to $t_{i+1}$ is the interval between the ith and i+1 sample points.

A phase-encoding waveform 150 is then applied in the second direction, causing the k-trajectory to move to point E in FIG. 3. The step $\Delta k_2$ is given by $$\Delta k_2 = \frac{2\pi}{x_2} = \gamma \int_{t_2}^{t_1} G_2(t)dt,$$

where $X_2$ is the spatial field of view in the second direction, $G_2$ is the strength of the second gradient, and $t_2 - t_1$ is the interval of application. No data sampling is performed during this period. The application of the next readout gradient pulse 142, which is applied with the same magnitude but in opposite polarity with the preceding gradient waveform 140, causes another rephasing of the nuclear signal in the direction of the third gradient at the position corresponding to $k_3 = 0$ on FIG. 3. Sampling of the data in the manner described above maps out a close to parallel trajectory in k-space from E to F in FIG. 3, displaced from the first trajectory from C to D by one phase-encoding step k in the second gradient direction. Subsequent repeated applications of the waveforms of the second and third gradient fields maps out a k-trajectory raster completely covering k-space.

Figure 5:
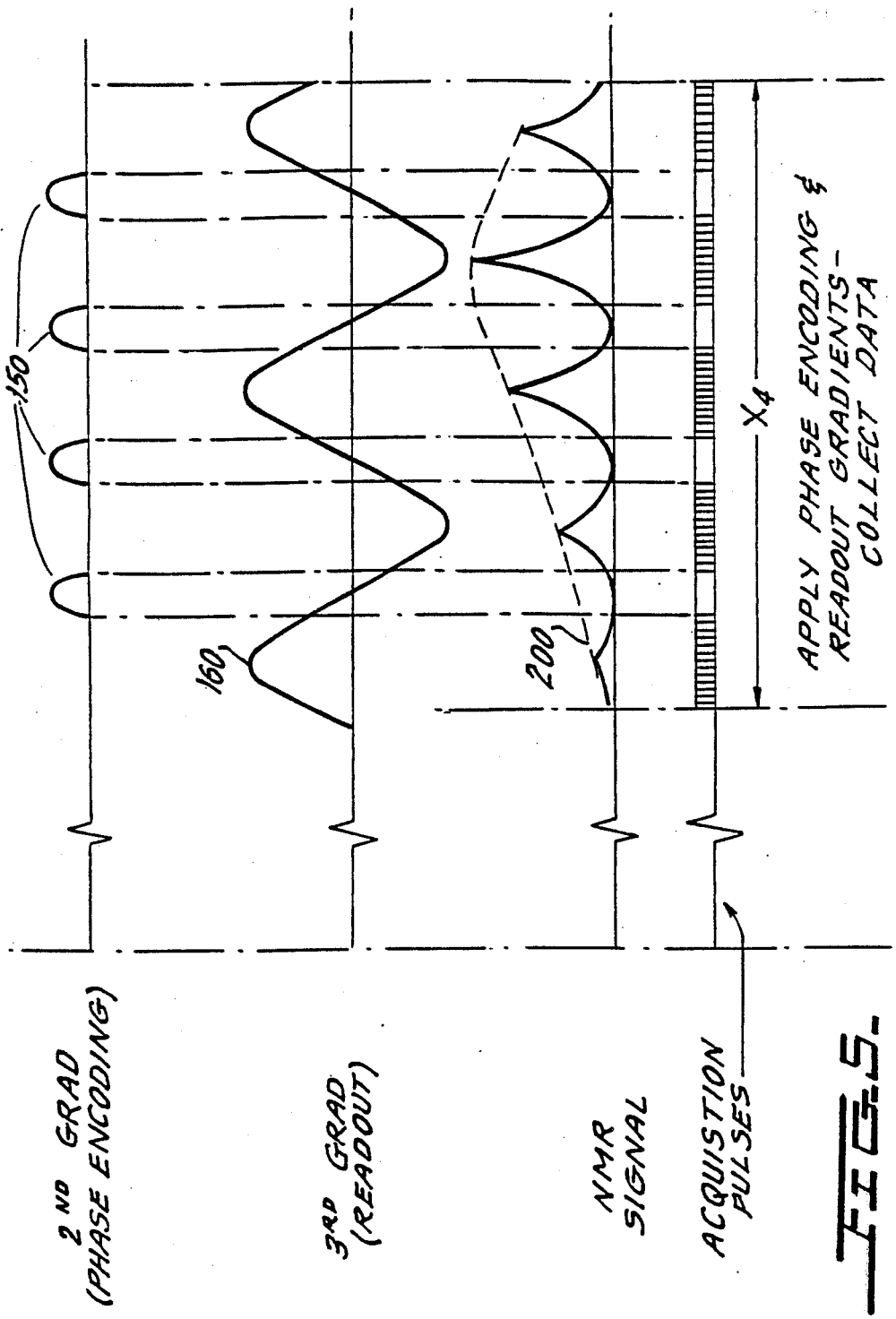
FIG. 5 is an enlargement of the acquisition pulse sequence shown in FIG. 2, but with the readout gradient applied as a continuous sinusoidal wave.

The readout gradient 140 shown in FIG. 2 is discontinuous; i.e., the gradient 140 waits at zero amplitude while a short pulse 150 of phase-encoding gradient is applied. In a preferred embodiment, shown in FIG. 5, the readout gradient is applied as a continuous sinusoidal wave 160. Phase-encoding gradients 150 are then applied as before, but centered approximately about the points at which the readout gradient 160 crosses through zero.

For short pulses of phase-encoding gradient 150, the few data points which are collected while both phase-encoding and readout gradient are on can be deleted prior to Fourier transformation with almost no image degradation. The advantages of this embodiment are that the acquisition time is shorter because there are no gaps in application of readout gradient. Therefore, motion artifacts from rapidly moving structures are reduced still further; the extent of $T_2$ and $T_2^*$ decay over the acquisition is reduced; and the echo envelope 200 may be centered closer to the initial 90° excitation pulse 116, thereby reducing signal loss which results from $T_2$ decay. Alternatively, the shorter acquisition means that more $k_2$ lines may be acquired in the same time as required in the original, non-continuous readout gradient case. In addition, the implementation of a continuous gradient waveform is conceivably technically simpler to achieve from a gradient waveform point of view, and the eddy current compensation may be simpler or more readily achievable.

Following the complete (approximately 100 millisecond) acquisition, the k-trajectory ends at point B on FIG. 3. Note that as the trajectory raster passes through $k_2 = 0$, maximum refocussing of the spins in the second gradient direction occurs, and at the point at which the trajectory crosses the origin of k-space, point A on FIG. 3, maximum refocussing in both the second and third gradient directions occurs, and a spin-echo signal approaching maximum amplitude is generated.

From FIG. 3 it may be seen that every alternate k-trajectory in the $k_3$ (or readout) direction is reversed. This is because of the need to reverse the third gradient in order to appropriately cover k-space. Consequently, the traverse across every alternate line in k-space must be reversed; this operation is equivalent to a time reversal of the appropriate data. Thus the trajectory shown in FIG. 3 of E, E+1, E+2 ... F-2, F-1, F becomes F, F-1, F-2 ... E+2, E+1, E. This procedure is repeated for every alternate line of k-space.

Additionally, it is desirable to correct the baseline offset of the data which may be generated by undesirable instrumental effects. This may be accomplished by sampling data from the quadrature output of the receiver immediately before application of the first RF pulse of the imaging sequence. Phase correction and filtering may also be necessary before the data are Fourier transformed. These steps are generally known in the art and do not require explanation.

The image is subsequently generated by performing a two-dimensional Fourier transform of the k-space data, which estimate in a discrete manner the diffraction pattern of the object. In particular, it should be noted that the image consists of the superposition of the Fourier transforms of the odd echoes (the 1st, 3rd, 5th, ... etc., acquired lines of k-space) with the even echoes (the 2nd, 4th, 6th, ... etc., acquired lines of the k-space). Consequently, it is possible to separately transform the odd and even echoes into partial images and modify them before combination. In fact, these processing steps may be desirable for instrumental reasons under certain circumstances. The modification of the partial images involves changing the phase and amplitude to eliminate any instrumentally induced errors.

Under certain circumstances, an MR image can be generated from a spatial frequency data set which is only partially complete in terms of its k-space coverage. In general, any phase-errors which arise as a result of magnetic field nonuniformities (due to the imperfections in the main magnet, magnetic susceptibility variations within the object under study and radio frequency field variations due to penetration effects and eddy currents) can be compensated for by acquiring the complete spatial frequency data set (full k-space acquisition) as described above with reference to FIGS. 2 and 3. However, it is possible to correct such phase errors even in the case where less than a complete acquisition is performed if the phase errors vary over the image only with low spatial frequencies.

For such partial k-space acquisitions, the pulse sequence of FIG. 2 is modified as follows. During the encoding period $x_2$, the area of waveform 120a or 120b is reduced such that the k-trajectory moves from A to $B^1$, where $k_2 (k_2)i < M$. Application of the RF pulse 117 causes relocation of the trajectory to the conjugate point $C^1$. The data acquisition then proceeds as before, but in this case less lines in the dimension $k_2$ of k-space are required to arrive at the final end-point B. As in the case of full k-space acquisition, rephasing in both second and third dimensions is maximal as the k-trajectory crosses the origin of k-space; point A on FIG. 3.

In order to minimize further phase errors and maximize the conjugate symmetry, it is desirable to arrange the k-space trajectory such that the point of rephasing in both second and third gradient directions, corresponding to point A on FIG. 3, corresponds in time exactly with the "field echo" generated as a result of application of the 180° RF pulse 117 and indicated by the dashed line 120b. If the time between application of the first and second Rf pulses, 116 and 117 respectively, is $t_1$, then the field echo will occur at the same time $t_1$ following the 180° RF pulse 117. Thus, for a reduced k-space acquisition, in order that the aforementioned maximal signal rephasing coincides with the peak of the field echo, the time $t_1$ before the 180° RF pulse 117 must be reduced appropriately.

Thus, partial k-space acquisition is achieved by omitting some of the encoding steps of either the positive or negative portions of k-space, but still sampling enough parts of k-space to estimate the phase variations in the image. Alternatively, the portion of k-space omitted may be in the orthogonal ($k_3$) direction, again still sampling enough symmetrical k-space to estimate the phase variations in the image.

Advantageously, the time saved in acquiring less than the entire data of k-space maybe utilized instead for: (1) acquiring additional non-symmetric lines of data in k-space in order to increase the resolution of the image; or (2) keeping the length of the total acquisition time as short as possible to reduce any motional artifacts or to reduce signal loss due to $T_2$ decay time.

Figure 4:
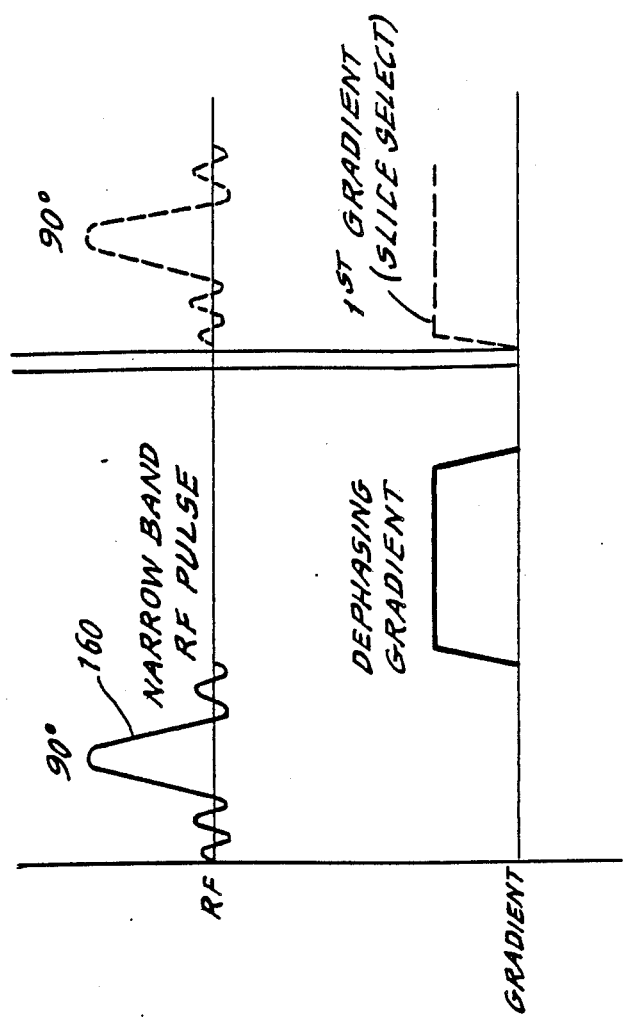
FIG. 4 shows, a suppression pulse sequence applied prior to slice-select to eliminate the chemical shift problem.

In order to eliminate the chemical shift problem, either of the two following methods may be followed. Referring to FIG. 4, in the first method, a 90° RF suppression pulse having a carrier frequency equivalent to the resonant frequency of one of the chemical moieties (water or fat) and with a bandwidth just wide enough to cover any broadening due to $T_2^*$ is applied prior to the application of the first (slice-selection) gradient.

A subsequent gradient pulse of sufficient magnitude will cause the phase response of the selected moiety to be shifted in k-space such that the selected moiety will completely be removed from the relevant portion of k-space and will not read out when the pulse sequence of FIG. 2 is applied. This type of suppression sequence is known in the art and requires no further explanation.

A second method for eliminating chemical shift is to reduce the frequency spectrum of the 180° rephasing pulse such that it is just wide enough to cover the resonant frequency of the desired chemical moiety. Thus, the undesired moiety will not be rephased (i.e., not shifted diagonally in k-space in FIG. 3) and will be moved out of the relevant portion of k-space (and produce no readout) during the sampling period. Such a method is disclosed in a paper by Peter M. Joseph entitled "A Spin Echo Chemical Shift MR Imaging Technique" published in the *Journal of Computer Assisted Topography*, 9(4): 651-658, July/August, Rowen L Press, N.Y. (1985).

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A method of deriving image information at high speed from an object using nuclear magnetic resonance signals, comprising the steps of:
    (a) subjecting an object to continuous static magnetic field along an axis, said magnetic field having a strength between about 0.5 and 5 Tesla;
    (b) exciting nuclear spins in the object by applying to the object a first radio frequency pulse, such that free induction decay signals are produced by said excited nuclear spins;
    (c) applying to the object an encoding sequence comprising a magnetic field gradient in a first direction together with a magnetic field gradient in a second direction different than said first direction;
    (d) applying a second radio frequency pulse to the object;
    (e) applying a readout sequence comprising a series of alternate applications to the object, respectively in time, of magnetic field gradient in said second direction defining readout gradients and magnetic field gradient in said first direction defining phase-encoding gradients, said readout sequence being completed within a period of time less than about 100 milliseconds; and
    (f) acquiring data to form a magnetic resonance image by sampling nuclear magnetic resonance signals output from said object during the application of said readout gradients to form a series of data values in the time domain, formatting said time domain data into modified data estimating the spatial frequencies of the object and transforming said modified data into spatial domain data for presentation as an image of the object.

2. The method of claim 1, wherein the length of said second radio frequency pulse of step (d) is selected to contain only a narrow band of frequency components, whereby the application of said second radio frequency pulse causes only one selected bandwidth of chemically shifted moiety to rephase.

3. The method of claim 1, further comprising a suppression period prior to step (b) comprising the application of a chemical shift suppression pulse sequence comprising the following steps:
    (a) applying a radio frequency pulse to the nuclear spins in the absence of any magnetic field gradients wherein the bandwidth of said pulse substantially encompasses the shifted moieties and the central frequency of said pulse lies at the same frequency as the line to be suppressed;
    (b) applying a magnetic field gradient having substantially more dephasing effect than any of the gradients of claim 1; and
    (c) repeating claim 1, step (b) by applying another radio frequency pulse.

4. The method of claim 1, wherein said second radio frequency pulse of claim 1, step (d) has an equal amount of magnetic field gradient applied before and after it for the purpose of destroying subsequent signal of any spins erroneously excited by imperfections in said second radio frequency pulse.

5. The method of claim 3, wherein said second radio frequency pulse of claim 1, step (d) is a spatially selective pulse and is applied in conjunction with magnetic field gradient in any direction.

6. The method of claim 4, wherein said second radio frequency pulse of claim 1, step (d) is a spatially selective pulse and is applied in conjunction with magnetic field gradient in any direction.

7. The method of claim 3, wherein said second radio frequency pulse of claim 1, step (d) is a broad band pulse having a wider frequency spectrum than the unmodified frequency spectrum of the whole signal producing region.

8. The method of claim 7, said second radio frequency pulse of claim 1, step (d) has an equal amount of magnetic field gradient applied before and after it for the purpose of destroying subsequent signal of any spins erroneously excited by imperfections in said second radio frequency pulse.

9. The method of claim 1, wherein either or both of said phase-encoding and readout gradients applied in claim 1, step (e) are approximately sinusoidal in form.

10. The method of claim 9, wherein said readout gradient is a continuous sinusoidal wave, and wherein the data acquired during the period when said phase-encoding and readout gradients overlap is deleted prior to said transformation.

11. The method of claim 1, wherein said data is acquired by sampling in equal steps.

12. The method of claim 1, wherein said data is acquired by sampling in non-equal steps.

13. The method of claim 1, wherein the time domain data is processed differently in parts and later combined to form said image of said object.

14. The method of claim 1, comprising the further step of taking a complex sample of the receiver baseline level before the application of the first radio frequency pulse and using it to correct the baseline offset of the subsequently acquired data.

15. The method of claim 1, wherein said first radio frequency pulse comprises a substantially 90° radio frequency pulse.

16. The method of claim 1, wherein said second radio frequency pulse comprises a substantially 180° radio frequency pulse.

17. The method of claim 1, wherein certain of the frequency domain data defining k-space is omitted by modifying the encoding sequence of claim 1, step (c), and/or by modifying the phase-encoding and readout gradients applied in claim 1, step (e), such that part of k-space is not sampled.

18. The method of claim 17, wherein the encoding sequence of claim 1, step (c) and the phase-encoding gradient applied in claim 1, step (e) are such that more than 50% of k-space is sampled in the direction of said phase-encoding gradient, the symmetric part of k-space sampled being sufficient to adequately represent the phase of the image.

19. The method of claim 17, wherein the encoding sequence of claim 1, step (c) and the readout gradient applied in claim 1, step (e) are such that more than 50% of k-space is sampled in the direction of said phase-encoding gradient, the symmetric part of k-space sampled being sufficient to adequately represent the phase of the image.

20. The method of claim 17, wherein the encoding sequence of claim 1, step (c) and the gradients applied in claim 1, step (e) are such that while only a portion of k-space is sampled, the same number of points are collected as in complete scanning of k-space, so that spatial frequency response is increased while signal bandwidth is maintained.

21. The method of claim 20, wherein at least two acquisitions are performed on different portions of k-space, the acquired portions being pieced together to form a continuous coverage of k-space in a k-space mosaic prior to transformation in claim 1, step (f).

22. The method of claim 21, wherein at least four overlapping or abutting acquisitions are performed, one in each quadrant of k-space, the acquired portions being pieced together to form a continuous coverage of k-space in a k-space mosaic prior to transformation in claim 1, step (f).

23. The method of claim 20, wherein a first set of two overlapping or abutting acquisitions are performed on opposite sides of k-space in the direction of the readout gradient, followed by a second set of overlapping or abutting acquisitions performed in the direction of the readout gradient, said second set of acquisitions being interleaved with said first set of acquisitions in the direction of the phase-encoding gradient.

24. A method of deriving image information at high speed from an object using nuclear magnetic resonance signals, comprising the steps of:
(a) subjecting an object to continuous static magnetic field along an axis, said magnetic field having a strength between about 0.5 and 5 Tesla;
(b) exciting nuclear spins in the object by applying to the object a first radio frequency pulse, such that free induction decay signals are produced by said excited nuclear spins;
(c) applying to the object an encoding sequence comprising a magnetic field gradient in a first direction together with a magnetic field gradient in a second direction different than said first direction;
(d) applying a readout sequence comprising a series of alternate applications to the object, respectively in time, of magnetic field gradient in said second direction defining readout gradients and magnetic field in said first direction defining phase-encoding gradients, said readout sequence being completed within a period of time less than about 100 milliseconds; and
(e) acquiring data to form a magnetic resonance image by sampling nuclear magnetic resonance signals output from said object during the application of said readout gradients to form a series of data values in the time domain, formatting said time domain data into modified data estimating the spatial frequencies of the object and transforming said modified data into spatial domain data for presentation as an image of the object.

25. The method of claim 24, further comprising a suppression period prior to step (b) comprising the application of a chemical shift suppression pulse sequence comprising the following steps:
(a) applying a radio frequency pulse to the nuclear spins in the absence of any magnetic field gradients wherein the bandwidth of said pulse substantially encompasses the shifted moieties and the central frequency of said pulse lies at the same frequency as the line to be suppressed;
(b) applying a magnetic field gradient having substantially more dephasing effect than any of the gradients of claim 24; and
(c) repeating claim 1, step (b) by applying another radio frequency pulse.

26. The method of claim 24, wherein either or both of said phase-encoding and readout gradients are approximately sinusoidal in form.

27. The method of claim 26, wherein said readout gradient is a continuous sinusoidal wave, and wherein the data acquired during the period when said phase-encoding and readout gradients overlap is deleted prior to said transformation.

28. The method of claim 24, wherein said data is acquired by sampling in equal steps.

29. The method of claim 24, wherein said data is acquired by sampling in non-equal steps.

30. The method of claim 24, comprising the further step of taking a complex sample of the receiver baseline level before the application of the first radio frequency pulse and using it to correct the baseline offset of the subsequently acquired data.

31. The method of claim 24, wherein said first radio frequency pulse comprises a substantially 90° radio frequency pulse.

32. The method of claim 24, wherein certain of the frequency domain data defining k-space is omitted by modifying the encoding sequence of claim 24, step (c), and/or by modifying the phase-encoding and readout gradients applied in claim 24, step (d), such that part of k-space is not sampled.

33. The method of claim 32, wherein the encoding sequence of claim 24, step (c) and the phase-encoding gradient applied in claim 24, step (d) are such that more than 50% of k-space is sampled in the direction of said phase-encoding gradient, the symmetric part of k-space sampled being sufficient to adequately represent the phase of the image.

34. The method of claim 32, wherein the encoding sequence of claim 24, step (c) and the readout gradient applied in claim 24, step (d) are such that more than 50% of k-space is sampled in the direction of said phase-encoding gradient, the symmetric part of k-space sampled being sufficient to adequately represent the phase of the image.

35. The method of claim 32, wherein the encoding sequence of claim 24, step (c) and the gradients applied in claim 24, step (d) are such that while only a portion of k-space is sampled, the same number of points are collected as in complete scanning of k-space, so that spatial frequency response is increased while signal bandwidth is maintained.

36. The method of claim 35, wherein at least two acquisitions are performed on different portions of k-space, the acquired portions being pieced together to form a continuous coverage of k-space in a k-space mosaic prior to transformation in claim 24, step (e).

37. The method of claim 36, wherein at least four overlapping or abutting acquisitions are performed, one in each quadrant of k-space, the acquired portions being pieced together to form a continuous coverage of k-space in a k-space mosaic prior to transformation in claim 24, step (e).

38. The method of claim 35, wherein a first set of two overlapping or abutting acquisitions are performed on opposite sides of k-space in the direction of the readout gradient, followed by a second set of overlapping or abutting acquisitions performed in the direction of the readout gradient, said second set of acquisitions being interleaved with said first set of acquisitions in the direction of the phase-encoding gradient.

39. The method of claim 24, wherein the time domain data is processed differently in parts and later combined to form said image of said object.

* * * * *